US012660397B2

(12) United States Patent
Lee et al.

(10) Patent No.: US 12,660,397 B2
(45) Date of Patent: Jun. 16, 2026

(54) TRANSPARENT DISPLAY DEVICE

(71) Applicant: LG Display Co., Ltd., Seoul (KR)

(72) Inventors: Seongku Lee, Paju-si (KR); Sunghee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 707 days.

(21) Appl. No.: 17/976,620

(22) Filed: Oct. 28, 2022

(65) Prior Publication Data

US 2023/0207605 A1     Jun. 29, 2023

(30) Foreign Application Priority Data

Dec. 27, 2021     (KR) ......................... 10-2021-0188677

(51) Int. Cl.
*H10H 29/10*          (2025.01)
*H10H 20/833*        (2025.01)

(52) U.S. Cl.
CPC .......... *H10H 29/10* (2025.01); *H10H 20/833* (2025.01)

(58) Field of Classification Search
None
See application file for complete search history.

(56) References Cited

U.S. PATENT DOCUMENTS

2019/0058021 A1*  2/2019  Kim ..................... G09G 3/3275
2020/0136068 A1*  4/2020  Lee ......................... H10K 71/00
2020/0273940 A1*  8/2020  Byun ................... G09G 3/3233
2020/0321292 A1*  10/2020 Park ..................... H10D 86/441
2021/0066418 A1    3/2021  Seo et al.

FOREIGN PATENT DOCUMENTS

| KR | 20170135587 A | 12/2017 |
| KR | 20180025058 A | 3/2018 |
| KR | 20190019731 A | 2/2019 |
| KR | 20200003336 A | 1/2020 |
| KR | 20210068753 A | 6/2021 |
| KR | 20210086141 A | 7/2021 |

* cited by examiner

*Primary Examiner* — Bilkis Jahan

(74) *Attorney, Agent, or Firm* — Seed Intellectual Property Law Group LLP

(57)          ABSTRACT

Disclosed is a transparent display device comprising a first substrate including a display area in which light emitting elements with light emitting layers are disposed and a non-display area surrounding the display area, a second substrate facing the first substrate, and a dam portion disposed between the non-display area of the first substrate and the second substrate so as to surround the display area in a plan view, wherein the light emitting layer of the light emitting element extends from the display area over the first substrate to the end of the non-display area, and the light emitting layer may include a separating prevention portion disposed between the outer periphery of the dam portion and the end of the non-display area, in the plan view over the first substrate.

40 Claims, 11 Drawing Sheets

TRANSPARENT DISPLAY DEVICE

BACKGROUND

Technical Field

The present disclosure relates to a transparent display device.

Description of the Related Art

With the advancement of an information-oriented society, attentions and requirements for a display device configured to display image have been increased in various types. Accordingly, a display device such as a Liquid Crystal Display (LCD), an organic light emitting display (OLED), a Micro Light Emitting Diode (Micro LED), a quantum dot display device (QD), or the like is utilized.

Recently, research has been actively conducted on a transparent display device which displays an image to a user and allows a user to view an object or an image located behind the display device by transmitting light therethrough.

The transparent display device may include a display area on which an image is displayed, and a non-display area, wherein the display area may include a transmission area and a non-transmission area. The transparent display device may have a high light transmittance in the display area through the transmission area.

Meanwhile, the transparent display device may be fabricated by forming an opaque dam portion DAM surrounding the periphery of lower and upper substrates and bonding the lower and upper substrates to each other. Since this opaque dam is located in the non-display area (or bezel area) of the transparent display device, there may be a sense of difference between the display area and the non-display area in the transparent display device. Also, if the plurality of transparent display devices are disposed adjacent to each other, it may cause deterioration of integration in the transparent display devices.

The technology discussed in this background is not admitted as prior art and may not, in fact be a prior art for this application of the present disclosure and it may include information the inventors learned as they identified and solved problems of the prior art and developed embodiments of the present disclosure.

BRIEF SUMMARY

Techniques of the disclosure overcome, among others, a problem of an opaque difference between a display area and a non-display area. A transparent display device is implemented to have a transparent structure with a transmission area in circuits (for example, GIP) disposed in the non-display area and to have a transparent bezel by applying a transparent dam instead of an opaque dam. However, there is a difference in visibility between the display area and the non-display area due to a structural difference between the display area and the non-display area.

Techniques of the disclosure overcome, among others, a problem of visibility difference between the display area and the transparent bezel of the transparent display device. A light emitting layer of the display area is extended to the non-display area, whereby it is possible to overcome the problem of visibility difference. However, as the light emitting layer is formed in the end of panel, the techniques prevent a peeling phenomenon caused by swelling of the light emitting layer and blocking the moisture permeation path to the inside of device. Through various experiments, a transparent display device having a new structure capable of reducing the visibility difference between the display area and the non-display area and preventing reliability of the transparent display device from being deteriorated has been invented.

The present disclosure provides a transparent display device capable of reducing a difference in visibility between a display area and a non-display area, blocking a moisture permeation path, and preventing a peeling (or separation) phenomenon.

In accordance with an aspect of the present disclosure, a transparent display device comprises a first substrate including a display area in which light emitting elements with light emitting layers are disposed and a non-display area surrounding the display area, a second substrate facing the first substrate, and a dam portion disposed between the non-display area of the first substrate and the second substrate so as to surround the display area in a plan view, wherein the light emitting layer of the light emitting element extends from the display area over the first substrate to the end of the non-display area, and the light emitting layer may include a separating prevention portion disposed between the outer periphery of the dam portion and the end of the non-display area, in the plan view over the first substrate.

In addition to the technical effects of the present disclosure as mentioned herein, additional advantages and features of the present disclosure will be clearly understood by those skilled in the art from the description of the present disclosure.

BRIEF DESCRIPTION OF THE SEVERAL VIEWS OF THE DRAWINGS

The technical benefits, features and other advantages of the present disclosure will be more clearly understood from the description described herein taken in conjunction with the accompanying drawings, in which.

DETAILED DESCRIPTION

Figure 1:
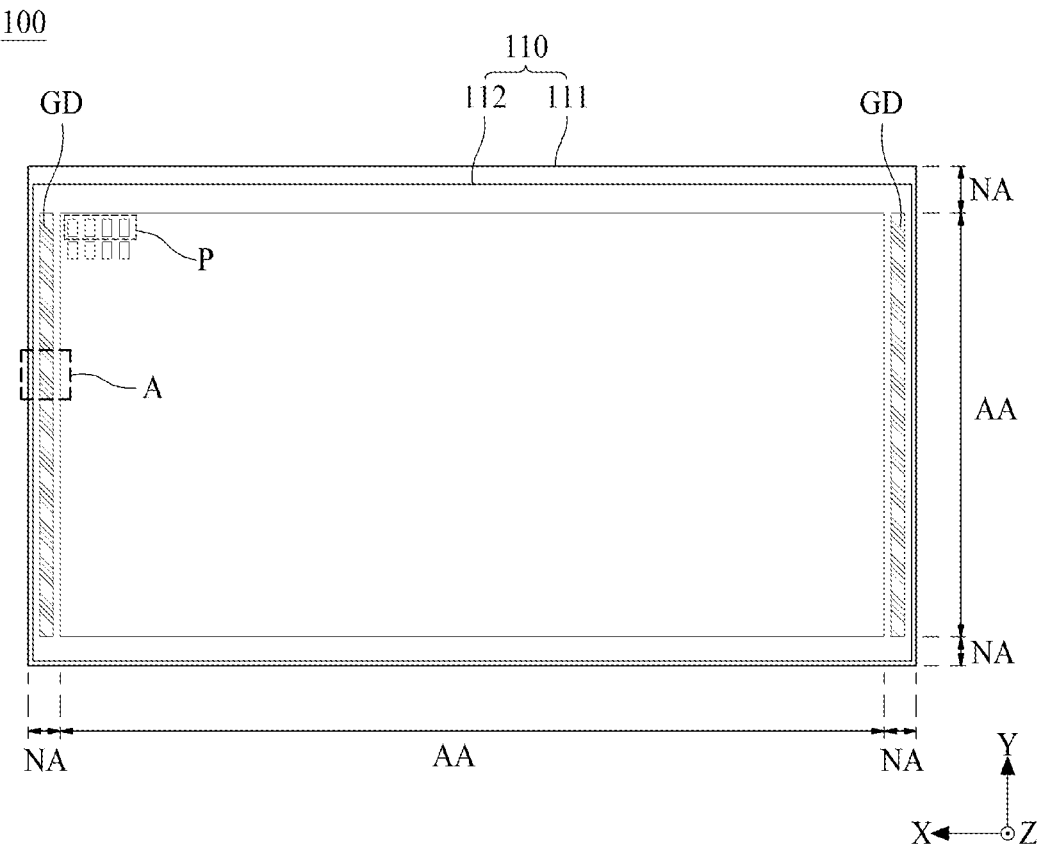
FIG. 1 is a plan view schematically illustrating a transparent display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to an embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together.

Hereinafter, example embodiments of a transparent display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a plan view schematically illustrating a transparent display device according to an embodiment of the present disclosure.

Hereinafter, the X-axis represents a direction parallel to a scan line, the Y-axis represents a direction parallel to a data line, and the Z-axis represents a height direction of the display device.

The transparent display device according to one embodiment of the present disclosure is implemented as an organic light emitting display OLED device, but may also be implemented as a liquid crystal display LCD device, a micro light emitting diode LED display device, a quantum dot QD display device, and etc.

Referring to FIG. 1, the transparent display device 100 according to an embodiment of the present disclosure may include a transparent display panel 110 including a first substrate 111 and a second substrate 112.

The first substrate 111 includes a thin film transistor, wherein the first substrate 111 may be a transparent glass substrate or a transparent plastic substrate. The first substrate 111 may include a display area AA for displaying an image by pixels formed thereon, and a non-display area NA on which an image is not displayed.

The display area AA may be the area for displaying an image, which may be an active area, a pixel array area, a display portion, or a screen. The display area AA may include a plurality of pixels P. The plurality of pixels P may be a unit area in which light is virtually emitted.

The non-display area NA may be the area in which an image is not displayed, and may be a peripheral circuit area, a signal supply area, an inactive area, or a bezel area. The non-display area NA may surround the display area AA. The transparent display panel 110 or the first substrate 111 may include a gate driver GD disposed in the non-display area NA.

The second substrate 112 may be bonded to the first substrate 111 via an adhesive member (or transparent adhesive) or may be bonded to the first substrate by an organic material or an inorganic material stacked at the first substrate 111. The second substrate 112 may be an upper substrate, an opposite substrate, or an encapsulation substrate, and may encapsulate the first substrate 111. For example, the second substrate 112 may have a smaller size than the first substrate 111 and may be bonded to the remaining portion except for a pad portion of the first substrate 111. The first substrate 111 and the second substrate 112 may be bonded to each other by a dam portion (shown in FIG. 3) disposed between the non-display area NA and the second substrate 112 so as to surround the display area AA in a plan view. The dam portion DAM may be an adhesive member or a transparent adhesive. The dam portion DAM may be disposed in a closed loop shape surrounding the display area AA over the first substrate 111. The dam portion DAM may be formed to surround the edge between the first substrate 111 and the second substrate 112, to encapsulate side surfaces of the first substrate 111 and the second substrate 112 from the outside.

Figure 2:
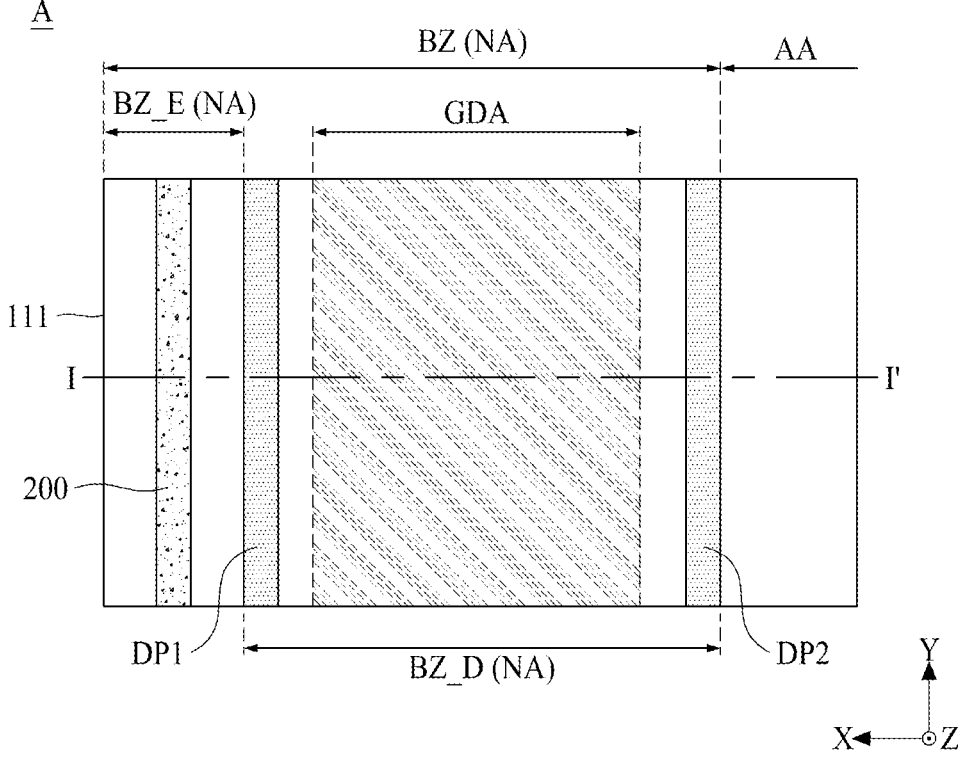
FIG. 2 is a plan view illustrating a bezel area of the transparent display device disposed in the area A of FIG. 1.
Figure 3:
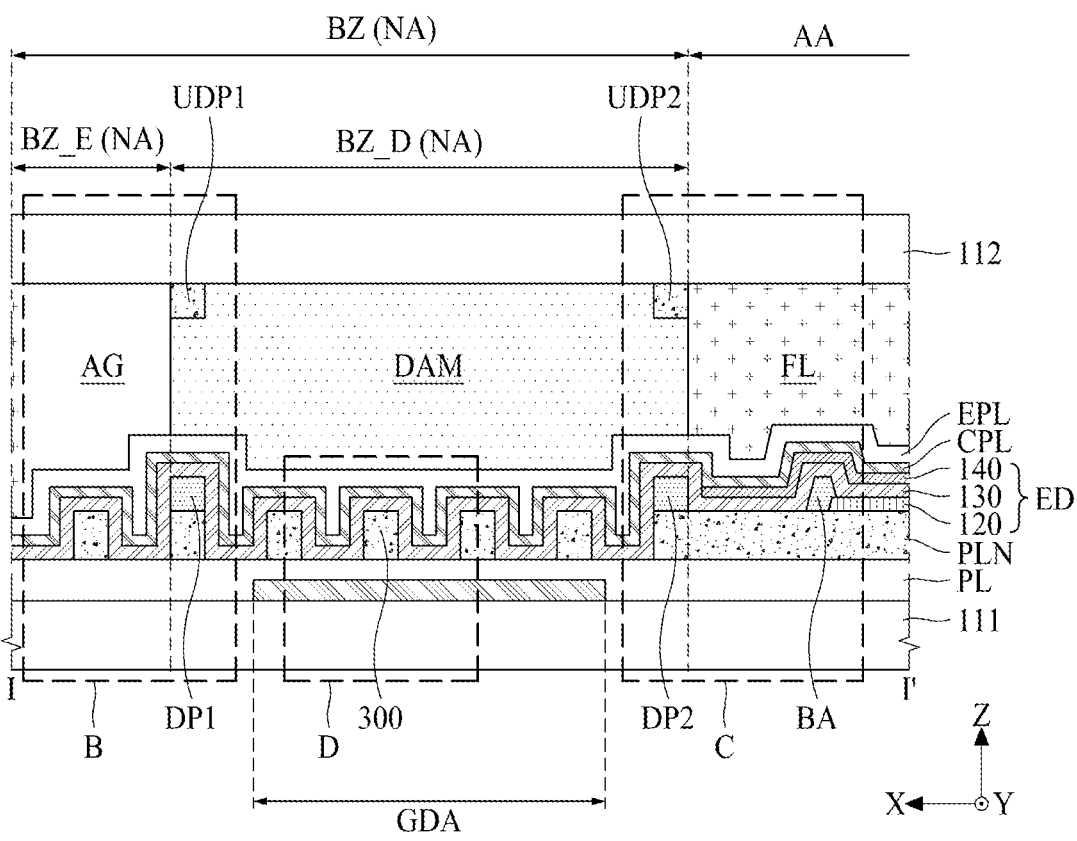
FIG. 3 is a cross-sectional view illustrating the bezel area of the transparent display device along I-I' of FIG. 2.

FIG. 2 is a plan view illustrating a bezel area of the transparent display device disposed in the area A of FIG. 1. FIG. 3 is a cross-sectional view illustrating the bezel area of the transparent display device along I-I' of FIG. 2.

Referring to FIGS. 2 and 3, the transparent display device 100 according to an embodiment of the present disclosure may include the display area AA and the bezel area BZ (or non-display area NA).

The display area AA may be the area in which an image is displayed, and may include gate lines, data lines, pixel power lines, common power lines, reference lines, and a plurality of pixels P. Each of the plurality of pixels P may include a plurality of subpixels arranged in every pixel region formed by the gate line and the data line which intersect each other. For example, the display area AA may be disposed in a central portion of the transparent display panel 110.

According to an embodiment of the present disclosure, the display area AA may include the plurality of subpixels and a transmission area disposed adjacent to some or all of the plurality of subpixels. The transmission area may be the area through which most of light incident from the outside passes. In addition, an area where the plurality of subpixels is disposed may be a non-transmission area which does not pass most of light incident from the outside. The transparent display device 100 may see an object or a background located on a rear surface (or rear surface) of the transparent display panel 110 owing to the transmission areas.

The bezel area BZ (or non-display area NA) may be the area in which an image is not displayed, and may be configured to surround the display area AA. The bezel area BZ may be the edge area surrounding the display area AA. The bezel area BZ may include a bezel dam portion BZ_D in which the dam portion DAM surrounding the edge between the first substrate 111 and the second substrate 112 is disposed, and a bezel edge portion BZ_E from the bezel dam portion BZ_D to the end of the first substrate 111. Since the bezel edge portion BZ_E is not covered (or overlaid) by the dam portion DAM, an air gap AG which is in direct contact with external air may be formed.

In case of the transparent display device 100 according to an embodiment of the present disclosure, the dam portion DAM may be formed of a transparent material so that the bezel area BZ may have the transparent characteristics, which helps to reduce or remove a potential opaque visible difference between the display area AA and the bezel area BZ. The dam portion DAM may include a thermosetting transparent adhesive or a photo-curable transparent adhesive. Alternatively or additionally, the dam portion DAM may include an absorbing material (not specifically shown for simplicity) capable of absorbing external vapor or moisture penetrating into the display area AA (not shown in FIG. 3).

The bezel area BZ may include the pad area in which pads are disposed and a gate driver GD including at least one gate driving circuit.

The gate driver GD may be connected to a scan line and may configured to supply a scan signal to the scan line. The gate driver GD may be implemented in a gate driver in panel (GIP) manner or a tape automated bonding (TAB) manner in the bezel area BZ at one outer side or both outer sides of the display area AA of the transparent display panel 110.

In the transparent display device 100 according to an embodiment of the present disclosure, the gate driver GD of the GIP manner may be provided with a transmission area which is identical or similar to the transmission area of the display area AA, which helps to reduce or remove a potential opaque visible difference between the display area AA and the bezel area BZ. The gate driver GD may be referred to as a transparent gate driver GD. The transparent gate driver GD may be disposed in a gate driver area GDA inside the bezel dam portion BZ_D at the bezel area BZ over the first substrate 111.

In the transparent display device 100 according to an embodiment of the present disclosure, if the bezel area BZ is implemented as a transparent bezel, a light emitting layer 130 of a light emitting element ED disposed in the display area AA is extended from the display area AA to the end of the first substrate 111, which helps to reduce or remove a potential visibility difference caused by the structural difference between the display area AA and the bezel area BZ.

The light emitting layer 130 may extend to the bezel edge portion BZ_E which is not covered (or overlaid) by the dam portion DAM. Since the air gap AG being in direct contact with the external air is formed in the bezel edge portion BZ_E, the bezel edge portion BZ_E may be directly exposed to external moisture, whereby the swelling caused by moisture may occur in the light emitting layer 130 disposed in the bezel edge portion BZ_E, and the separation phenomenon of the light emitting layer 130 may be diffused to the dam portion DAM.

According to an embodiment of the present disclosure, the bezel edge portion BZ_E may include a separation prevention portion 200 to prevent the separation phenomenon caused by the swelling of the light emitting layer 130. A detailed description of the separation prevention portion 200 will be described later with reference to FIGS. 4A to 4C.

Referring to FIG. 3, the transparent display device 100 according to an embodiment of the present disclosure may include the gate driver area GDA with the gate driver GD disposed in the bezel dam portion BZ_D at the bezel area BZ of the first substrate 111.

A plurality of inorganic insulating films PL formed of an inorganic insulating material may be disposed over the first substrate 111 on which the gate driver GD is disposed.

A thin film transistor for driving the light emitting element ED of the display area AA, a thin film transistor constituting the plurality of gate driving circuits included in the gate driver GD, and a planarization film PLN for planarizing a step difference caused by various signal lines may be disposed over the plurality of inorganic insulating films PL.

The light emitting element ED including a first electrode 120, the light emitting layer 130, and a second electrode 140, and a bank BA may be disposed over the planarization film PLN disposed in the display area AA. Over the planarization film PLN disposed in the bezel area BZ (or non-display area NA), there is the light emitting layer 130 extending from the display area AA.

The dam portion DAM may be disposed over the planarization film PLN disposed in the bezel dam portion BZ_D in the bezel area BZ. The dam portion DAM may be disposed between the first substrate 111 and the second substrate 112. A first dam pattern portion DP1 which defines an outer line of the dam portion DAM and a second dam pattern portion DP2 which defines an inner line of the dam portion DAM may be disposed over the planarization film PLN. Also, the second substrate 112 may include a first upper dam pattern portion UDP1 partially overlapped with the first dam pattern portion DP1 and a second upper dam pattern portion UDP2 partially overlapped with the second dam pattern portion DP2.

The first dam pattern portion DP1 and the first upper dam pattern portion UDP1 may serve to prevent the dam portion DAM from overflowing to the outside of the transparent display panel 110. Also, the second dam pattern portion DP2 and the second upper dam pattern portion UDP2 may serve to prevent the dam portion DAM from overflowing toward the inside of the transparent display panel 110. A detailed description of the dam portion DAM will be described later with reference to FIGS. 4A to 5C.

In the bezel dam portion BZ_D, the planarization film PLN between the first dam pattern portion DP1 and the second dam pattern portion DP2 may be applied with a moisture-permeating prevention portion 300 which prevents external moisture from penetrating into the display area AA through the light emitting layer 130 extending from the display area AA to the end of the first substrate 111. A detailed description of the moisture-permeating prevention portion 300 will be described later with reference to FIGS. 6A and 6B.

A capping layer CPL may be disposed over the second electrode 140 of the light emitting element ED disposed in the display area AA and the light emitting layer 130 disposed in the bezel area BZ. The capping layer CPL may be formed on the entire area from the display area AA to the bezel area BZ. In this case, the capping layer CPL may be configured to overcome the visibility difference between the display area AA and the bezel area BZ, but not limited thereto. The capping layer CPL may be omitted from components of the transparent display device 100.

An encapsulation layer EPL may be disposed over the capping layer CPL. The encapsulation layer EPL may prevent oxygen or moisture from penetrating into the light emitting layer 130 and the second electrode 140. To this end, the encapsulation layer EPL may include at least one inorganic film or may include at least one inorganic film and at least one organic film.

The display area AA between the first substrate 111 and the second substrate 112 may include a filling member FL that fills a gap GAP between the first substrate 111 and the second substrate 112. The filling member FL may have a barrier function which prevents moisture from penetrating through the second substrate 112. According to an embodiment of the present disclosure, the filling member FL may be formed of a transparent material. For example, the filling member FL may include a thermosetting transparent adhesive or a photo-curable transparent adhesive. In this case, the filling member FL may be used to bond the first substrate 111 and the second substrate 112 together with the dam portion DAM.

Figure 4A:
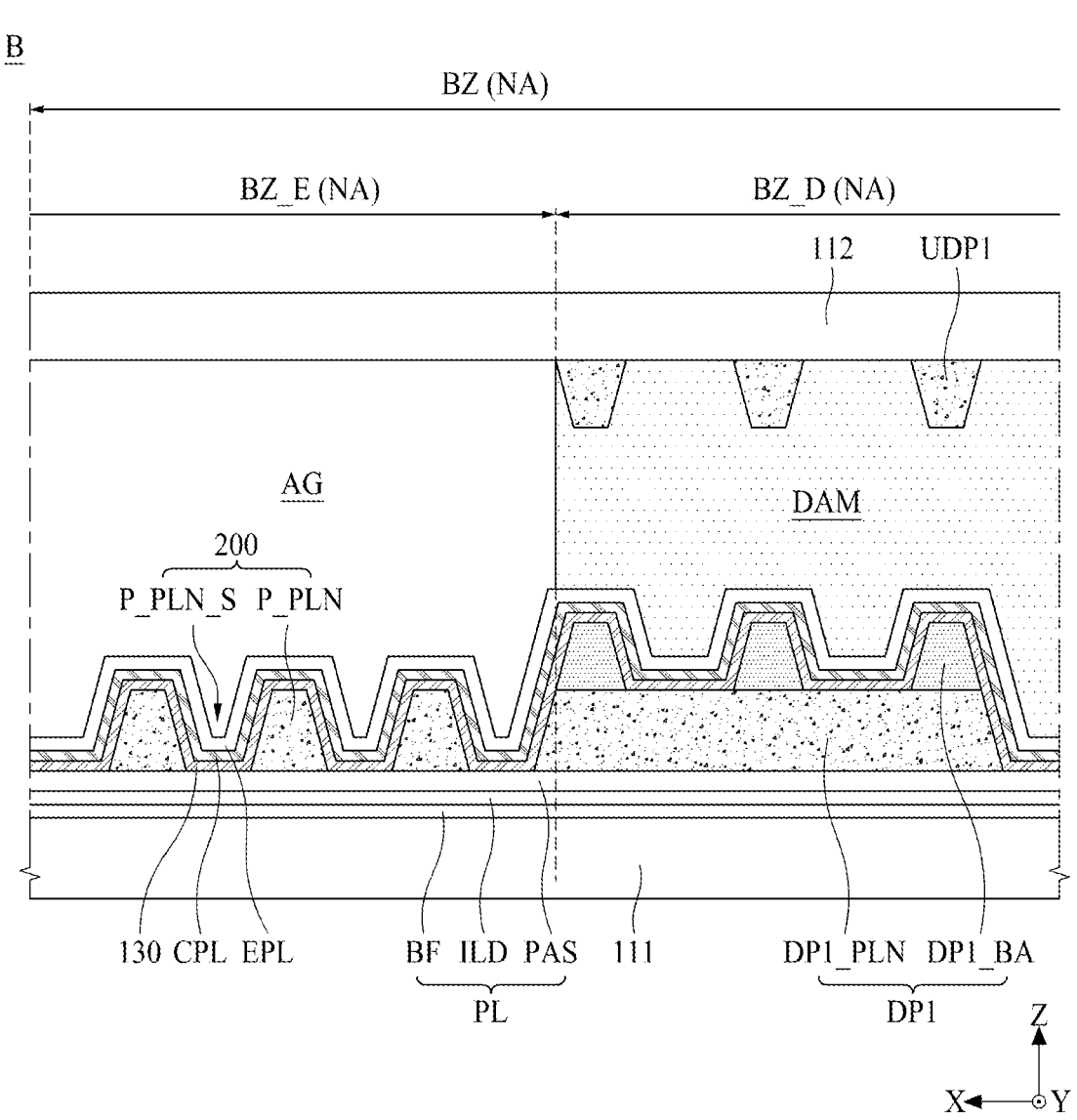
FIG. 4A is a cross-sectional view illustrating an example of a separating prevention portion and a first dam pattern disposed in the area B of FIG. 3.
Figure 4B:
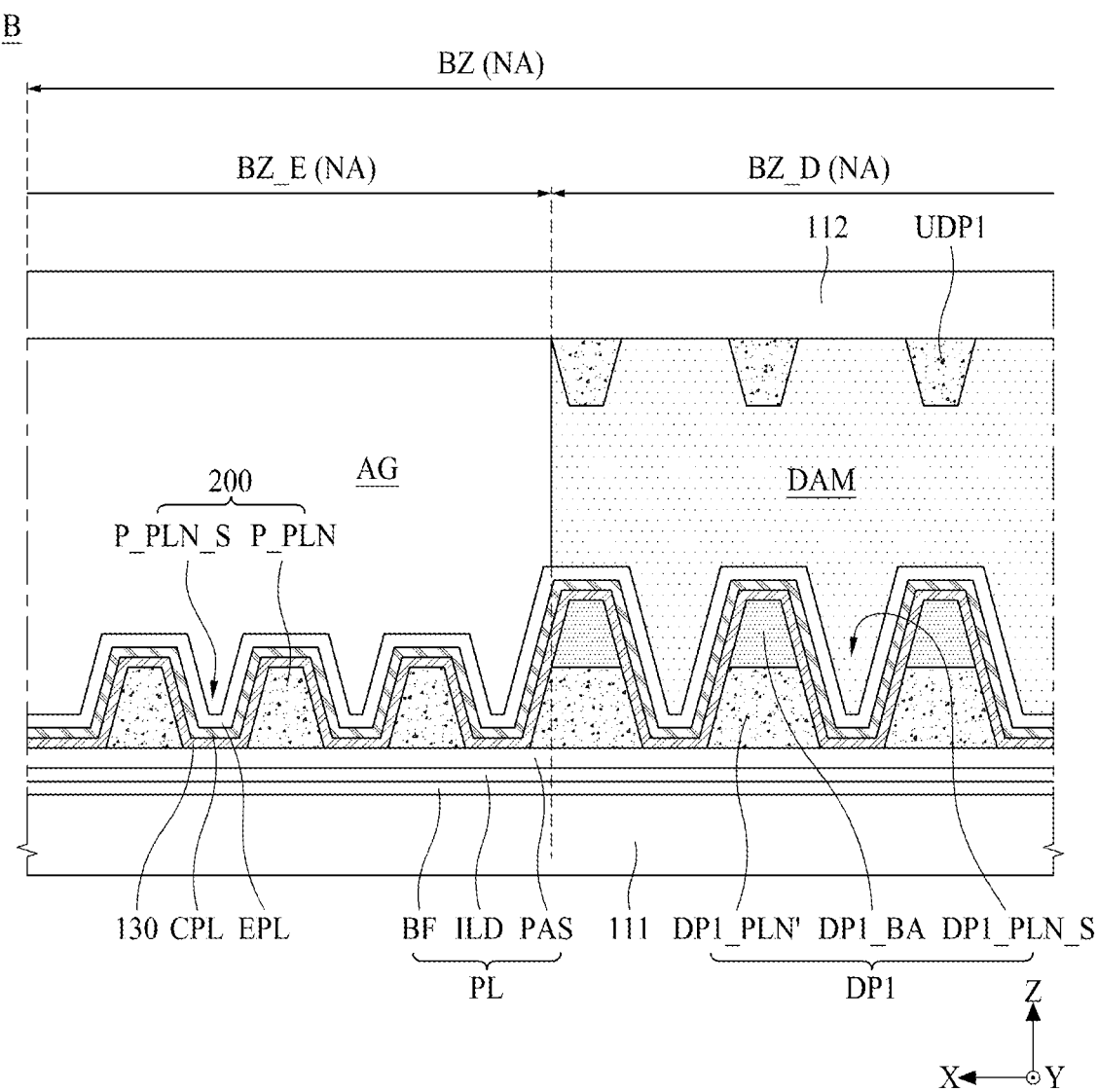
FIG. 4B is a cross-sectional view illustrating another example of a separating prevention portion and a first dam pattern disposed in the area B of FIG. 3.

FIG. 4A is a cross-sectional view illustrating an example of a separating prevention portion and a first dam pattern portion disposed in the area B of FIG. 3. FIG. 4B is a cross-sectional view illustrating another example of a separating prevention portion and a first dam pattern portion disposed in the area B of FIG. 3.

Figure 4C:
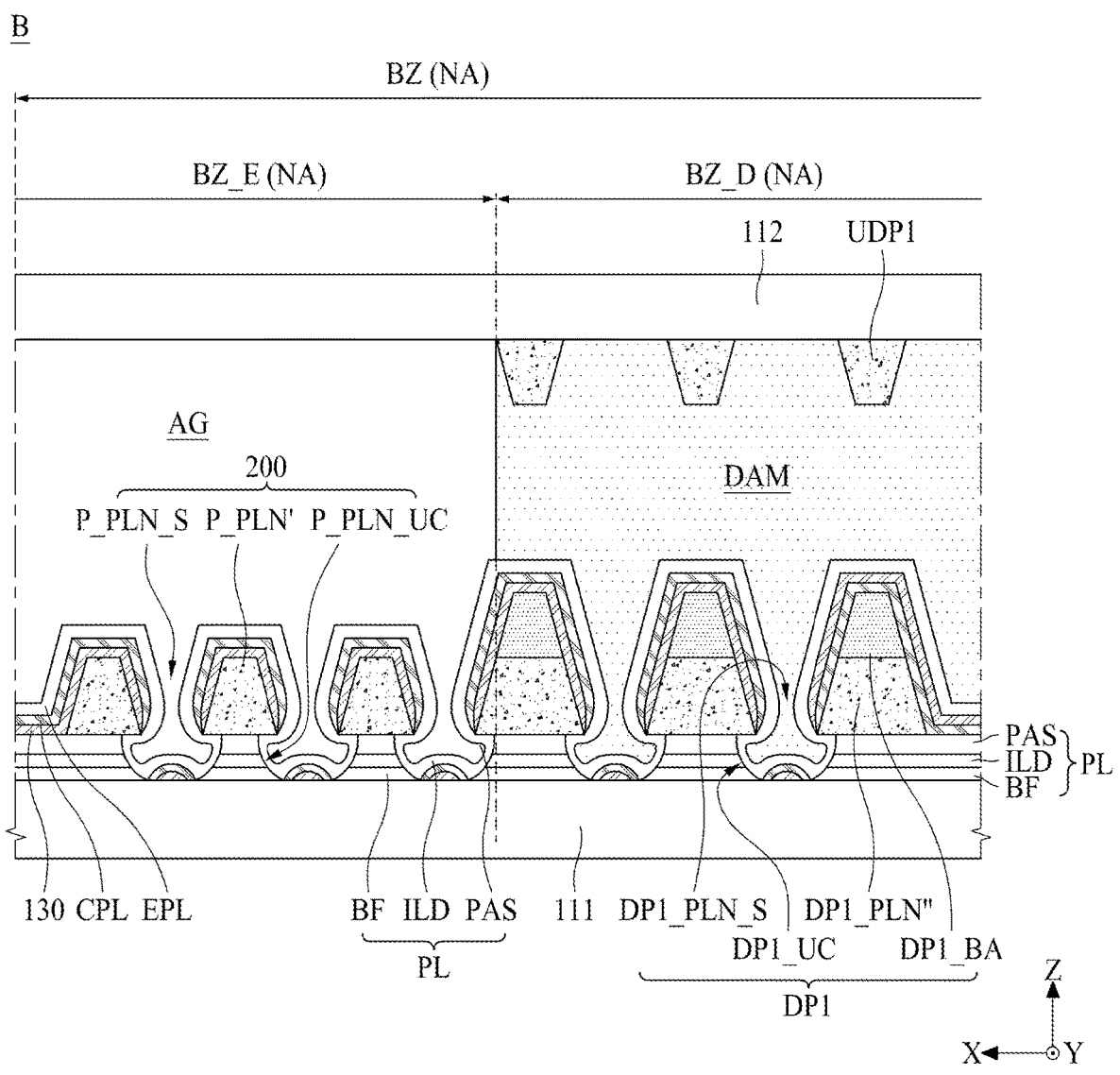
FIG. 4C is a cross-sectional view illustrating another example of a separating prevention portion and a first dam pattern disposed in the area B of FIG. 3.

Referring to FIGS. 4A to 4C, the transparent display device 100 according to an embodiment of the present disclosure may include the bezel edge portion BZ_E and the bezel dam portion BZ_D in the bezel area BZ. The separating prevention portion 200 may be disposed at the bezel edge portion BZ_E of the first substrate 111, and the first dam pattern portion DP1 may be disposed at the bezel dam portion BZ_D of the first substrate 111. Also, the first upper dam pattern portion UDP1 partially overlapped with the first dam pattern portion DP1 may be disposed over the second substrate 112, the first dam pattern portion DP1 may be disposed between the first substrate 111 and the second substrate 112, and the dam portion DAM may be disposed from the first upper dam pattern portion UDP1 to the display area AA.

Referring to FIG. 4A, the separating prevention portion 200 according to an embodiment of the present disclosure may be disposed over the plurality of inorganic insulating films PL PP including a buffer film BF, a gate insulating film GI, an interlayer insulating film ILD, and a passivation film PAS disposed over the first substrate 111.

The light emitting layer 130 extending from the display area AA may be disposed over the separating prevention portion 200. Also, a capping layer CPL and an encapsulation layer EPL may be sequentially stacked over the light emitting layer 130. The separating prevention portion 200 may be disposed in the bezel edge portion BZ_E which is not overlapped with the dam portion DAM. The separating prevention portion 200 may be disposed in a closed loop shape surrounding the periphery of the dam portion DAM in a plane view of the first substrate 111.

The separating prevention portion 200 may include at least one peeling pattern P_PLN formed of an organic insulating material and a slit portion P_PLN_S for isolating at least one peeling pattern P_PLN. The adjacent peeling patterns P_PLN may be spaced apart from each other with the slit portion P_PLN_S interposed therebetween and may be disposed in parallel to each other. For example, the separating prevention portion 200 may include the plurality of peeling patterns P_PLN and the plurality of slit portions P_PLN_S, wherein each slit portion P_PLN_S is interposed between each of the peeling patterns P_PLN. For example, at least one peeling pattern P_PLN may provide in the same layer as the planarization film PLN over the first substrate 111 and may be formed of the same material as the planarization film PLN. For example, the at least one peeling pattern P_PLN and the planarization film PLN may be formed of an organic film such as acryl resin, epoxy resin, phenolic resin, polyamide resin, polyimide resin, or the like. In addition, the slit portion P_PLN_S may be formed by patterning the adjacent peeling patterns P_PLN to be spaced apart from each other, or may be formed together with the peeling pattern P_PLN through an etching process of the organic insulating material (e.g., planarization film PLN), but not limited thereto. The slit portion P_PLN_S may be formed in the form of a concave groove between the adjacent peeling patterns P_PLN. The slit portion P_PLN_S may be formed to have a width which gradually decreases in a direction from the second substrate 112 toward the first substrate 111.

The at least one peeling pattern P_PLN and the slit portion P_PLN_S of the separating prevention portion 200 according to an embodiment of the present disclosure may be alternately arranged over the bezel edge portion BZ_E, to thereby form an uneven shape over the bezel edge portion BZ_E of the first substrate 111. Accordingly, the light emitting layer 130 disposed in the bezel edge portion BZ_E may be formed in an uneven shape by the separating prevention portion 200.

According to an embodiment of the present disclosure, since the light emitting layer 130 is formed in an uneven shape in the bezel edge portion BZ_E by the separating prevention portion 200, the moisture permeation path by the light emitting layer 130 may be extended. Also, even though the swelling occurs due to moisture, the light emitting layer 130 may be disconnected by the uneven structure, thereby preventing the diffusion in separation of the light emitting layer 130. In addition, the moisture permeation path may be increased in the light emitting layer 130 owing to the plurality of slit portions P_PLN_S having the concave groove as compared to the case where there is no slit portion, whereby the moisture permeation through the light emitting layer 130 may be reduced or prevented.

Accordingly, in the transparent display device 100 according to an embodiment of the present disclosure, the visibility difference between the display area AA and the bezel area BZ may be reduced by the light emitting layer 130 extending to the bezel area BZ, and it is possible to prevent the moisture permeation path and the separation phenomenon, thereby improving the reliability of the device.

Referring to FIG. 4C, the separating prevention portion 200 according to an embodiment of the present disclosure may be disposed over the plurality of inorganic insulating films PL including a buffer film BF, an interlayer insulating film ILD, and a passivation film PAS disposed over the first substrate 111.

The light emitting layer 130 extending from the display area AA may be disposed over the separating prevention portion 200. Also, a capping layer CPL and an encapsulation layer EPL may be sequentially stacked over the light emitting layer 130. The separating prevention portion 200 may be disposed in the bezel edge portion BZ_E which is not overlapped with the dam portion DAM. The separating prevention portion 200 may be disposed in a closed loop shape surrounding the periphery of the dam portion DAM in a plane view of the first substrate 111.

The separating prevention portion 200 may include at least one peeling pattern P_PLN' formed of an organic insulating material and a slit portion P_PLN_S for isolating at least one peeling pattern P_PLN'. The adjacent peeling patterns P_PLN' may be spaced apart from each other with the slit portion P_PLN_S interposed therebetween and may be disposed in parallel to each other. For example, the separating prevention portion 200 may include the plurality of peeling patterns P_PLN' and the plurality of slit portions P_PLN_S, wherein each slit portion P_PLN_S is interposed between each of the peeling patterns P_PLN'.

The slit portion P_PLN_S may include an undercut structure P_PLN_UC which exposes at least a portion of the lower edge of the peeling pattern P_PLN'. For example, each of the plurality of slit portions P_PLN_S may include the undercut structure P_PLN_UC which exposes at least a portion of the lower edge of the adjacent peeling pattern P_PLN'.

For example, an upper surface of the plurality of inorganic insulating films PL including the buffer film BF, the interlayer insulating film ILD, and the passivation film PAS disposed over the first substrate 111 may be exposed in the slit portion P_PLN_S, and the undercut structure P_PL-N_UC of the slit portion P_PLN_S may be formed through a wet etching process for the exposed plurality of inorganic insulating films PL. For example, the plurality of inorganic insulating films PL exposed through the slit portions P_PLN_S may be over-etched to expose the lower edge of the peeling pattern P_PLN', whereby side surfaces of the plurality of inorganic insulating films PL may be inwardly provided in comparison to the peeling pattern P_PLN' in the area overlapped with the edge of the peeling pattern P_PLN', to thereby form the undercut structure P_PLN_UC of the slit portion P_PLN. However, the present disclosure is not limited thereto.

The at least one peeling pattern P_PLN' and the slit portion P_PLN_S of the separating prevention portion 200 according to an embodiment of the present disclosure may be alternately arranged over the bezel edge portion BZ_E, and the undercut structure P_PLN_UC may be formed in the slit portion P_PLN_S, thereby forming the uneven shape having the undercut structure over the bezel edge portion BZ_E of the first substrate 111. Accordingly, the light emitting layer 130 disposed in the bezel edge portion BZ_E may be formed in the uneven shape which is disconnectedly provided in each of the undercut structures P_PLN_UC by the separating prevention portion 200 having the undercut structure P_PLN_UC.

According to an embodiment of the present disclosure, since the light emitting layer 130 is formed as the disconnected uneven shape in the bezel edge portion BZ_E by the separating prevention portion 200 having the undercut structure P_PLN_UC, it is possible to extend the moisture permeation path disconnectedly provided by the light emitting layer 130. Also, even though the swelling occurs in the outermost light emitting layer 130 due to moisture, the light emitting layer 130 may be disconnected by the undercut structure, thereby preventing the diffusion in separation of the light emitting layer 130. Accordingly, the visibility difference between the display area AA and the bezel area BZ in the transparent display device 100 according to an embodiment of the present disclosure may be reduced by the light emitting layer 130 extending to the bezel area BZ, and it is possible to prevent the moisture permeation path and the separation phenomenon, thereby improving the reliability of the device.

Referring to FIG. 4A, the dam portion DAM according to an embodiment of the present disclosure may be disposed between the first substrate 111 and the second substrate 112. The dam portion DAM may be disposed in the bezel dam portion BZ_D between the display area AA and the bezel edge portion BZ_E in the bezel area BZ. The dam portion DAM may include the first dam pattern portion DP1 disposed over the first substrate 111 and the first upper dam pattern portion UDP1 disposed over the second substrate 112.

The first dam pattern portion DP1 may be disposed over the plurality of inorganic insulating films PL including the buffer film BF, the interlayer insulating film ILD, and the passivation film PAS disposed over the first substrate 111, and the first upper dam pattern portion UDP1 may be partially overlapped with the first dam pattern portion DP1 over the second substrate 112.

The first dam pattern portion DP1 and the first upper dam pattern portion UDP1 may define the outer line of the dam portion DAM. The first dam pattern portion DP1 and the first upper dam pattern portion UDP 1 may prevent the dam portion DAM from overflowing to the outside of the transparent display panel 110.

The light emitting layer 130 extending from the display area AA may be disposed over the first dam pattern portion DP1. In addition, the capping layer CPL and the encapsulation layer EPL may be sequentially stacked over the light emitting layer 130. The first dam pattern portion DP1 may be disposed in a closed loop shape defining the outer line of the dam portion DAM in a plane view of the first substrate 111.

The first dam pattern portion DP1 according to an embodiment of the present disclosure may be formed of at least one organic insulating material. The first dam pattern portion DP1 may include at least one first organic pattern DP1_BA formed of an organic insulating material and a second organic pattern DP1_PLN formed of an organic insulating material and configured to support at least one first organic pattern DP1_BA. For example, the first dam pattern portion DP1 may include a plurality of first organic patterns DP1_BA. The second organic pattern DP1_PLN may overlap the plurality of first organic patterns DP1_BA and may support the plurality of first organic patterns DP1_BA. The adjacent first organic patterns DP1_BA may be spaced apart from each other at predetermined intervals over the second organic pattern DP1_PLN, and may be disposed in parallel to each other. The first organic patterns DP1_BA which are spaced apart from each other may be formed by patterning the first organic patterns DP1_BA to be spaced apart from each other over the second organic pattern DP1_PLN, or may be formed by an etching process of the organic insulating material (e.g., bank BA). For example, the second organic pattern DP1_PLN may be provided in the same layer as the planarization film PLN over the first substrate 111 and may be formed of the same material as the planarization film PLN, and the first organic pattern DP1_BA may be provided in the same layer as the bank BA over the first substrate 111 and may be formed of the same material as the bank BA. For example, the at least one first organic pattern DP1_BA and the bank BA may be formed of an organic film such as acryl resin, epoxy resin, phenolic resin, polyamide resin, polyimide resin, or the like. However, the present disclosure is not limited thereto. FIG. 4A illustrates that the first dam pattern portion DP1 includes three of the first organic patterns DP1_BA, but not limited thereto. For example, the number of the first organic patterns DP1_BA included in the first dam pattern portion DP1 may be more than three or may be less than three.

The first upper dam pattern portion UDP1 may be formed of a transparent organic insulating material. The first upper dam pattern portion UDP1 may be disposed to overlap the first organic pattern DP1_BA of the first dam pattern portion DP1. For example, the first upper dam pattern portion UDP1 may include a plurality of organic patterns spaced apart from each other. The first upper dam pattern portion UDP1 may be disposed in a closed loop shape defining the outer line of the dam portion DAM in a plane view of the second substrate 112. As another example, the first upper dam pattern portion UDP1 may not overlap the first organic pattern DP1_BA of the first dam pattern portion DP1. For example, the first upper dam pattern portion UDP1 may be disposed between the first organic patterns DP1_BA adjacent to each other in a plan view and may be alternately arranged with each other.

Referring to FIG. 4B, the dam portion DAM according to an embodiment of the present disclosure may be disposed between the first substrate 111 and the second substrate 112. The dam portion DAM may be disposed in the bezel dam portion BZ_D between the display area AA and the bezel edge portion BZ_E in the bezel area BZ. The dam portion DAM may include the first dam pattern portion DP1 disposed over the first substrate 111 and the first upper dam pattern portion UDP1 disposed over the second substrate 112.

The first dam pattern portion DP1 according to an embodiment of the present disclosure may be formed of at least one organic insulating material. The first dam pattern portion DP1 may include at least one first organic pattern DP1_BA formed of an organic insulating material and at least one second organic pattern DP1_PLN' formed of an organic insulating material. For example, the first dam pattern portion DP1 may include the plurality of first organic patterns DP1_BA, and may include the plurality of second organic patterns DP1_PLN' to respectively support the plurality of first organic patterns DP1_BA. Between the adjacent first and second organic patterns DP1_BA and DP1_PLN', there may be a slit portion DP1_PLN_S. For example, the plurality of slit portions DP1_PLN_S may be included between the plurality of first and second organic patterns DP1_BA and DP1_PLN'. The adjacent first and second organic patterns DP1_BA and DP1_PLN' may be spaced apart from each other with the slit portion DP1_PLN_S interposed therebetween. For example, the second organic pattern DP1_PLN' may be provided in the same layer as the planarization film PLN over the first substrate 111 and may be formed of the same material as the planarization film PLN, and the first organic pattern DP1_BA may be provided in the same layer as the bank BA over the first substrate 111 and may be formed of the same material as the bank BA. Also, the slit portion DP PLN_S may be formed by patterning the adjacent first and second organic patterns DP1_BA and DP1_PLN' to be spaced apart from each other, or may be formed together with the first and second organic patterns DP1_BA and DP1_PLN' through an etching process for the stacked organic insulating material (e.g., planarization film PLN and bank BA). However, the present disclosure is not limited thereto.

Referring to FIG. 4C, the dam portion DAM according to an embodiment of the present disclosure may be disposed between the first substrate 111 and the second substrate 112. The dam portion DAM may be disposed in the bezel dam portion BZ_D between the display area AA and the bezel edge portion BZ_E in the bezel area BZ. The dam portion DAM may include the first dam pattern portion DP1 disposed over the first substrate 111 and the first upper dam pattern portion UDP1 disposed over the second substrate 112.

The first dam pattern portion DP1 according to an embodiment of the present disclosure may be formed of at least one organic insulating material. The first dam pattern portion DP1 may include at least one first organic pattern DP1_BA formed of an organic insulating material and at least one second organic pattern DP1_PLN" formed of an organic insulating material. For example, the first dam pattern portion DP1 may include the plurality of first organic patterns DP1_BA, and may include the plurality of second organic patterns DP1_PLN" to respectively support the plurality of first organic patterns DP1_BA. Between the adjacent first and second organic patterns DP1_BA and DP1_PLN", the slit portion DP1_PLN_S may be included. For example, the plurality of slit portions DP PLN_S may be included between the plurality of first and second organic patterns DP1_BA and DP1_PLN". The slit portion DP1_PLN_S may include an undercut structure DP1_UC that exposes at least a portion of the lower edge of the second organic pattern DP1_PLN". For example, an upper surface of the plurality of inorganic insulating films PL including the buffer film BF, the interlayer insulating film ILD, and the passivation film PAS disposed over the first substrate 111 may be exposed in the slit portion DP1_PLN_S, and the undercut structure DP1_UC of the slit portion DP1_PLN_S may be formed through a wet etching process for the exposed plurality of inorganic insulating films PL. For example, the plurality of inorganic insulating films PL exposed through the slit portion DP1_PLN_S may be over-etched to expose the lower edge of the second organic pattern DP1_PLN", whereby side surfaces of the plurality of inorganic insulating films PL may be inwardly provided in comparison to the second organic pattern DP1_PLN" in the area overlapped with the edge of the second organic pattern DP1_PLN", to thereby form the undercut structure DP1_UC of the slit portion DP1_PLN_S. However, the present disclosure is not limited thereto.

Figure 5A:
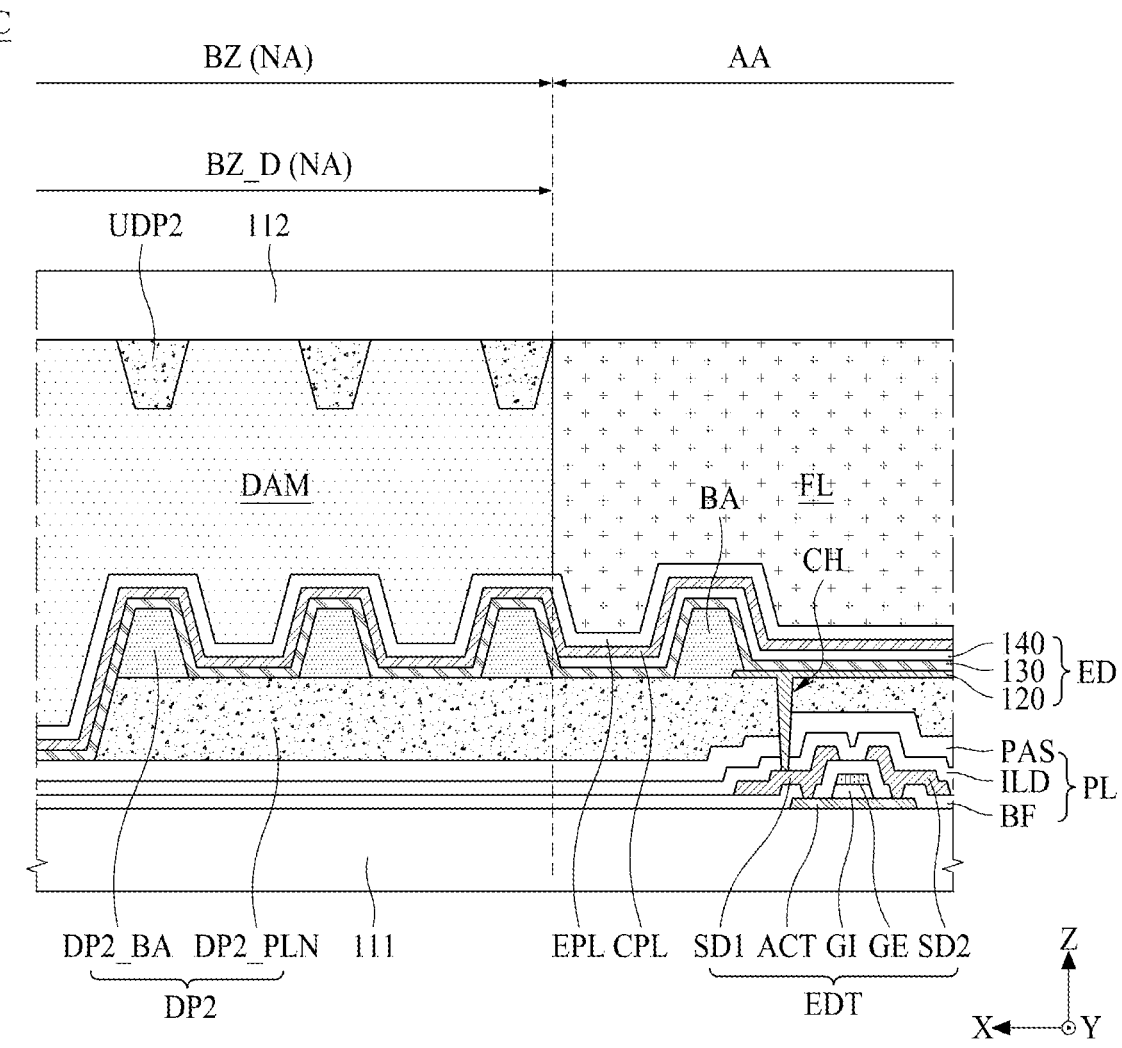
FIG. 5A is a cross-sectional view illustrating one example of a second dam pattern and a light emitting element disposed in the area C of FIG. 3.
Figure 5B:
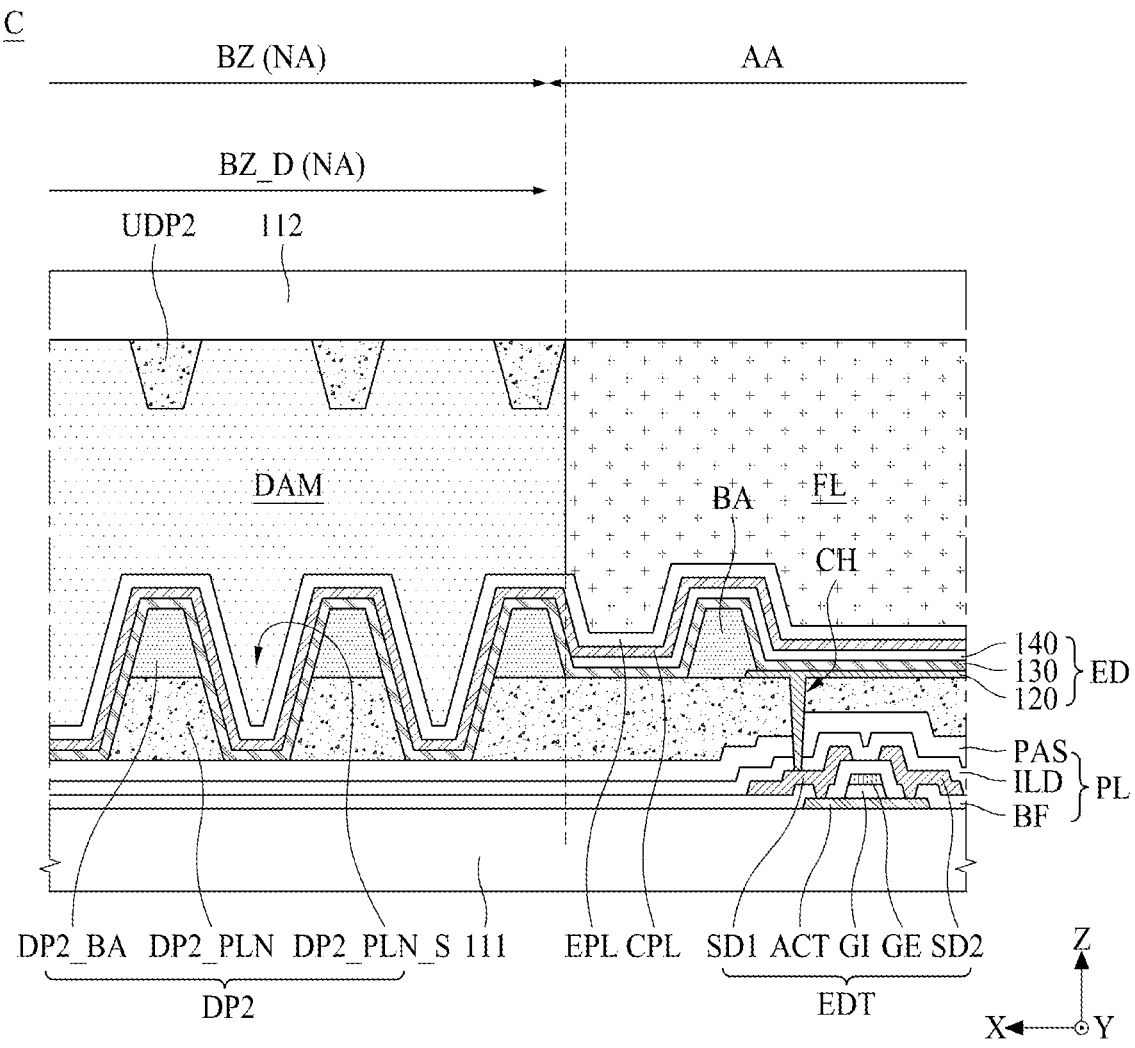
FIG. 5B is a cross-sectional view illustrating another example of a second dam pattern and a light emitting element disposed in the area C of FIG. 3.
Figure 5C:
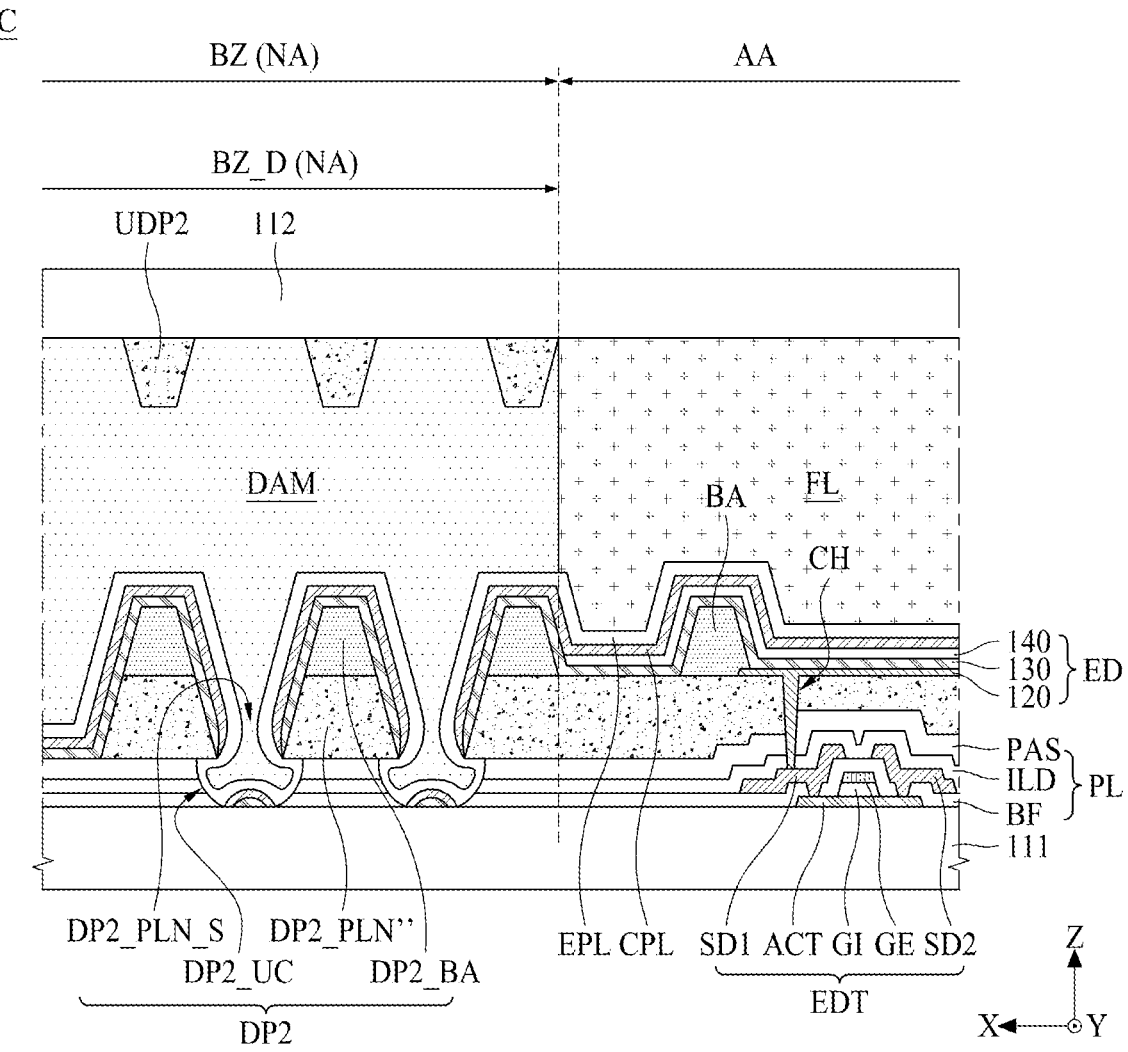
FIG. 5C is a cross-sectional view illustrating another example of a second dam pattern and a light emitting element disposed in the area C of FIG. 3.

FIG. 5A is a cross-sectional view illustrating one example of a second dam pattern and a light emitting element disposed in the area C of FIG. 3. FIG. 5B is a cross-sectional view illustrating another example of a second dam pattern and a light emitting element disposed in the area C of FIG. 3. FIG. 5C is a cross-sectional view illustrating another example of a second dam pattern and a light emitting element disposed in the area C of FIG. 3.

Referring to FIGS. 5A to 5C, the transparent display device 100 according to an embodiment of the present disclosure may include a bezel area BZ and a display area AA, wherein a bezel dam portion BZ_D may be included in the bezel area BZ. A light emitting element ED and a thin film transistor EDT for driving the light emitting element ED may be disposed at the display area AA of the first substrate 111. Also, a second upper dam pattern portion UDP2 overlapped with at least a portion of a second dam pattern portion DP2 may be disposed over the second substrate 112, and a dam portion DAM may be provided from the second dam pattern portion DP2 and the second upper dam pattern portion UDP2 between the first substrate 111 and the second substrate 112.

The light emitting element ED and the thin film transistor EDT may be disposed in the display area AA. The thin film transistor EDT may include an active layer ACT, a gate electrode GE, and first and second source/drain electrodes SD1 and SD2. In addition, the light emitting element ED may include a first electrode 120, a light emitting layer 130, and a second electrode 140. A light emission area may be defined by a bank BA. The bank BA may cover (or overlay) a portion of the edge of the first electrode 120 of the light emitting element ED, thereby defining the light emission area. The first electrode 120 of the light emitting element ED may be electrically connected to the thin film transistor EDT through a contact hole CH penetrating insulating layers between the first electrode 120 and the thin film transistor EDT. However, the present disclosure is not limited thereto.

The display area AA between the first substrate 111 and the second substrate 112 may include a filling member FL for filling a gap between the first substrate 111 and the second substrate 112. The filling member FL may have a barrier function which prevents moisture from penetrating through the second substrate 112. According to an embodiment of the present disclosure, the filling member FL may be formed of a transparent material.

The bezel area BZ (or non-display area NA) between the first substrate 111 and the second substrate 112 may include a dam portion DAM which bonds edges of the first substrate 111 and the second substrate 112 to each other and encapsulates the side surface between the first and second substrates 111 and 112 from an external air. The dam portion DAM may be formed of a transparent material.

Referring to FIG. 5A, the dam portion DAM according to an embodiment of the present disclosure may be disposed between the first substrate 111 and the second substrate 112. The dam portion DAM may be disposed in the bezel dam portion BZ_D between the bezel edge portion BZ_E and the display area AA. The dam portion DAM may include a second dam pattern portion DP2 disposed over the first substrate 111 and a second upper dam pattern portion UDP2 disposed over the second substrate 112.

The second dam pattern portion DP2 may be disposed over a plurality of inorganic insulating films PL including a buffer film BF, an interlayer insulating film ILD, and a passivation film PAS disposed over the first substrate 111, and the second upper dam pattern portion UDP2 may be disposed over the second substrate 112 while being partially overlapped with the second dam pattern portion DP2.

The second dam pattern portion DP2 and the second upper dam pattern portion UDP2 may define an inner line of the dam portion DAM. The second dam pattern portion DP2 and the second upper dam pattern portion UDP2 may serve to prevent the dam portion DAM from overflowing toward the inside of the transparent display panel 110.

The light emitting layer 130 extending from the display area AA may be disposed over the second dam pattern portion DP2. Also, a capping layer CPL and an encapsulation layer EPL may be sequentially stacked over the light emitting layer 130. The second dam pattern portion DP2 may be disposed in a closed loop shape defining the inner line of the dam portion DAM in a plane view of the first substrate 111.

The second dam pattern portion DP2 according to one embodiment of the present disclosure may be formed of at least one organic insulating material. The second dam pattern portion DP2 may include at least one first organic pattern DP2_BA formed of an organic insulating material and a second organic pattern DP2_PLN formed of an organic insulating material and configured to support at least one first organic pattern DP2_BA. For example, the second dam pattern portion DP2 may include a plurality of first organic patterns DP2_BA. The second organic pattern DP2_PLN may overlap the plurality of first organic patterns DP2_BA and may support the plurality of first organic patterns DP2_BA. The adjacent first organic patterns DP2_BA may be spaced apart from each other at predetermined intervals over the second organic pattern DP2_PLN and may be disposed in parallel to each other. The first organic patterns DP2_BA spaced apart from each other may be formed by patterning the first organic patterns DP2_BA to be spaced apart from each other over the second organic pattern DP2_PLN or may be formed through an etching process of the organic insulating material (e.g., bank BA). For example, the second organic pattern DP2_PLN may be provided in the same layer as the planarization film PLN over the first substrate 111 and may be formed of the same material as the planarization film PLN, and the first organic pattern DP2_BA may be provided in the same layer as the bank BA over the first substrate 111 and may be formed of the same material as the bank BA. FIG. 5A illustrates that the second dam pattern portion DP2 includes at least three of the first organic pattern DP2_BA, but not limited thereto. For example, the number of the first organic patterns DP2_BA included in the second dam pattern portion DP2 may be more than three or may be less than three.

The second upper dam pattern portion UDP2 may be formed of a transparent organic insulating material. The second upper dam pattern portion UDP2 may be disposed to overlap the first organic pattern DP2_BA of the second dam pattern portion DP2. For example, the second upper dam pattern portion UDP2 may include a plurality of organic patterns spaced apart from each other. The second upper dam pattern portion UDP2 may be disposed in a closed loop shape defining an inner line of the dam portion DAM in a plane view of the second substrate 112. As another example, the second upper dam pattern portion UDP2 may not overlap the first organic pattern DP2_BA of the second dam pattern portion DP2. For example, the second upper dam pattern portion UDP2 may be disposed between the first organic patterns DP2_BA adjacent to each other in a plan view and the second upper dam pattern portion UDP2 and the first organic patterns DP2_BA may be alternately arranged with each other.

Referring to FIG. 5B, the dam portion DAM according to an embodiment of the present disclosure may be disposed between the first substrate 111 and the second substrate 112. The dam portion DAM may be disposed in the bezel dam portion BZ_D between the display area AA and the bezel edge portion BZ_E in the bezel area BZ. The dam portion DAM may include a second dam pattern portion DP2 disposed over the first substrate 111 and a second upper dam pattern portion UDP2 disposed over the second substrate 112.

The second dam pattern portion DP2 according to an embodiment of the present disclosure may be formed of at least one organic insulating material. The second dam pattern portion DP2 may include at least one first organic pattern DP2_BA formed of an organic insulating material and at least one second organic pattern DP2_PLN' formed of an organic insulating material. For example, the second dam pattern portion DP2 may include a plurality of first organic patterns DP2_BA, and may include a plurality of second organic patterns DP2_PLN to respectively support the plurality of first organic patterns DP2_BA. Between the adjacent first and second organic patterns DP2_BA and DP2_PLN', a slit portion DP2_PLN_S may be included. For example, the plurality of slit portions DP2_PLN_S may be included between the plurality of first and second organic patterns DP2_BA and DP2_PLN'. The adjacent first and second organic patterns DP2_BA and DP2_PLN' may be spaced apart from each other with the slit portion DP2_PLN_S interposed therebetween, and may be disposed in parallel to each other. For example, the second organic pattern DP2_PLN may be provided in the same layer as the planarization film PLN over the first substrate 111 and may be formed of the same material as the planarization film PLN, and the first organic pattern DP2_BA may be provided in the same layer as the bank BA over the first substrate 111 and may be formed of the same material as the bank BA. Also, the slit portion DP2_PLN_S may be formed by patterning the adjacent first and second organic patterns DP2_BA and DP2_PLN' to be spaced apart from each other, or may be formed together with the first and second organic patterns DP2_BA and DP2_PLN' through an etching process for the stacked organic insulating material (e.g., planarization film PLN and bank BA). However, the present disclosure is not limited thereto.

Referring to FIG. 5C, the dam portion DAM according to an embodiment of the present disclosure may be disposed between the first substrate 111 and the second substrate 112. The dam portion DAM may be disposed in the bezel dam portion BZ_D between the display area AA and the bezel edge portion BZ_E in the bezel area BZ. The dam portion DAM may include a second dam pattern portion DP2 disposed over the first substrate 111 and a second upper dam pattern portion UDP2 disposed over the second substrate 112.

The second dam pattern portion DP2 according to an embodiment of the present disclosure may be formed of at least one organic insulating material. The second dam pattern portion DP2 may include at least one first organic pattern DP2_BA formed of an organic insulating material and at least one second organic pattern DP2_PLN" formed of an organic insulating material. For example, the second dam pattern portion DP2 may include a plurality of first organic patterns DP2_BA and may include a plurality of second organic patterns DP2_PLN" to respectively support the plurality of first organic patterns DP2_BA. Between the adjacent first and second organic patterns DP2_BA and DP2_PLN", a slit portion DP2_PLN_S may be included. For example, the plurality of slit portions DP2_PLN_S may be included between the plurality of first and second organic patterns DP2_BA and DP2_PLN". The slit portion DP2_PLN_S may include an undercut structure DP2_UC which exposes at least a portion of the lower edge of the second organic pattern DP2_PLN". For example, an upper surface of the plurality of inorganic insulating films PL including the buffer film BF, the interlayer insulating film ILD, and the passivation film PAS disposed over the first substrate 111 may be exposed in the slit portion DP2_PLN_S, and the undercut structure DP2_UC of the slit portion DP2_PLN_S may be formed through a wet etching process for the exposed plurality of inorganic insulating films PL. For example, the plurality of inorganic insulating films PL exposed through the slit portions DP2_PLN_S may be over-etched to expose the lower edge of the second organic pattern DP2_PLN", whereby side surfaces of the plurality of inorganic insulating films PL may be inwardly provided in comparison to the second organic pattern DP2_PLN" in the area overlapped with the edge of the second organic pattern DP2_PLN", to thereby form the undercut structure DP2_UC of the slit portion DP2_PLN_S. However, the present disclosure is not limited thereto.

Figure 6A:
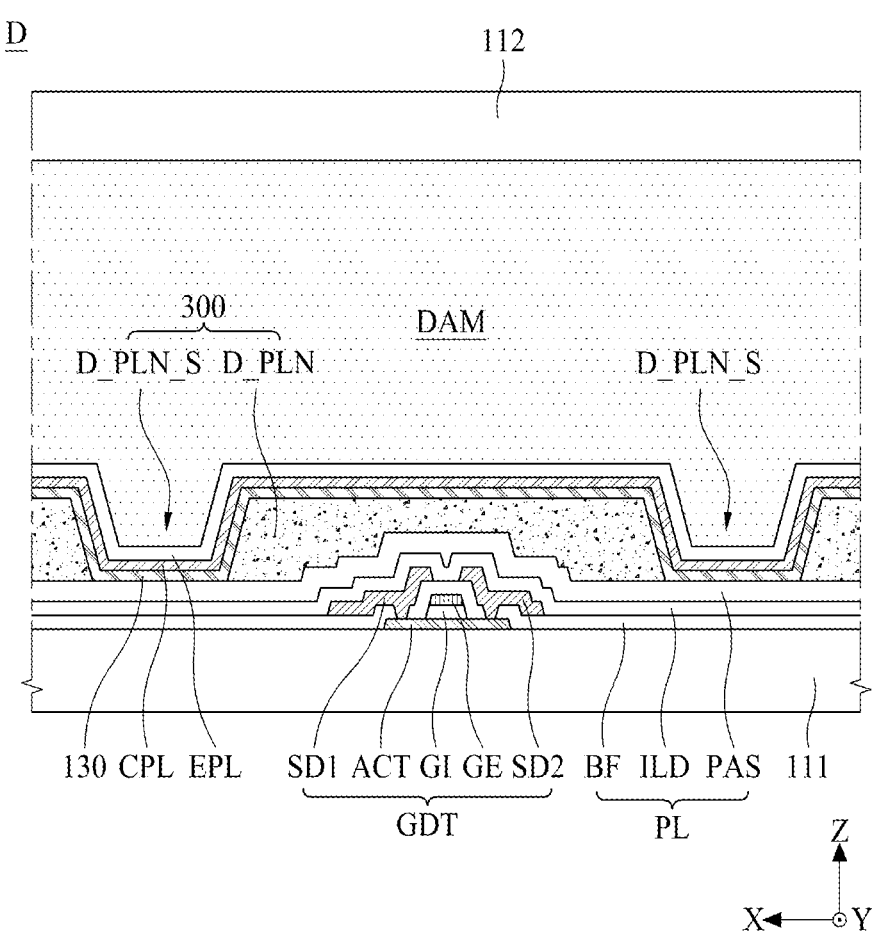
FIG. 6A is a cross-sectional view illustrating one example of a moisture-permeating prevention portion disposed in the area D of FIG. 3.
Figure 6B:
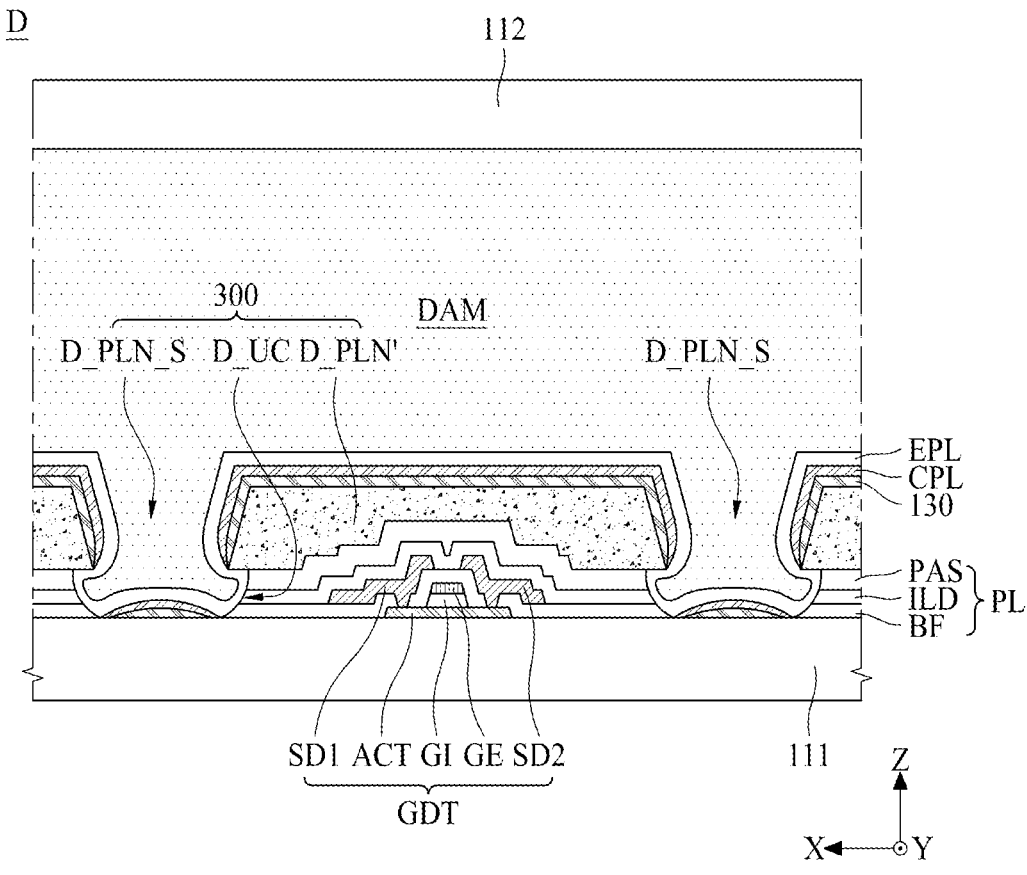
FIG. 6B is a cross-sectional view illustrating another example of a moisture-permeating prevention portion disposed in the area D of FIG. 3.

FIG. 6A is a cross-sectional view illustrating one example of a moisture-permeating prevention portion disposed in the area D of FIG. 3. FIG. 6B is a cross-sectional view illustrating another example of a moisture-permeating prevention portion disposed in the area D of FIG. 3.

Referring to FIGS. 6A and 6B, the transparent display device 100 according to an embodiment of the present disclosure may include a bezel area BZ and a display area AA, wherein the bezel area BZ may include a bezel dam portion BZ_D. The bezel dam portion BZ_D may be a portion in which a dam portion DAM is disposed over the first substrate 111.

A gate driver GD including at least one gate driving circuit may be disposed in the bezel dam portion BZ_D over the first substrate 111. The gate driver GD may be disposed between a first dam pattern portion DP1 and a second dam pattern portion DP2 in the bezel dam portion BZ_D. At least one moisture-permeating prevention portion 300 may be disposed in the bezel dam portion BZ_D over the first substrate 111. The at least one moisture-permeating prevention portion 300 may be disposed between the first dam pattern portion DP1 and the second dam pattern portion DP2 in the bezel dam portion BZ_D. Also, a dam portion DAM may be disposed between the first substrate 111 and the second substrate 112.

The gate driver GD may include at least one thin film transistor GDT. The thin film transistor GDT may include an active layer ACT, a gate electrode GE, and first and second source/drain electrodes SD1 and SD2. The gate driver GD according to an embodiment of the present disclosure may include a transmissive area having a function which is the same as or similar to that of the transmission area of the display area AA. The gate driver GD may be referred to as a transparent gate driver GD. For example, at least one thin film transistor GDT of the gate driver GD may be disposed to be the same as or similar to the non-transmission area of the display area AA, and the transmission area of the gate driver GD may be disposed to be the same as or similar to the transmission area of the display area AA. However, the present disclosure is not limited thereto.

A plurality of inorganic insulating films PL including a buffer film BF, a gate insulating film GI, an interlayer insulating film ILD, and a passivation film PAS may be disposed over the first substrate 111 on which the gate driver GD is disposed.

A planarization film PLN may be disposed over the plurality of inorganic insulating films PL, to thereby planarize step coverage caused by the gate driver GD and various signal lines.

A light emitting layer 130 of a light emitting element ED extending from the display area AA may be disposed over the planarization film PLN. In addition, a capping layer CPL and an encapsulation layer EPL may be sequentially stacked over the light emitting layer 130.

The transparent display device 100 according to an embodiment of the present disclosure may include at least one moisture-permeating prevention portion 300 formed by changing the structure of the planarization film PLN disposed in the bezel dam portion BZ_D.

Referring to FIG. 6A, the at least one moisture-permeating prevention portion 300 according to an embodiment of the present disclosure may be disposed over the thin film transistor GDT of the gate driver GD disposed over the first substrate 111 and the plurality of inorganic insulating films PL including the buffer film BF, the gate insulating film GI, the interlayer insulating film ILD, and the passivation film PAS for covering (or overlaying) the thin film transistor GDT.

The light emitting layer 130 extending from the display area AA may be disposed over the at least one moisture-permeating prevention portion 300. In addition, the capping layer CPL and the encapsulation layer EPL may be sequentially stacked over the light emitting layer 130. The at least one moisture-permeating prevention portion 300 may be disposed in the bezel dam portion BZ_D. Each of the at least one moisture-permeating prevention portion 300 may be formed in a simulated shape with a structure which is the same as or similar to that of a pixel disposed in the display area AA. Also, if the gate driver GD is implemented as a transparent gate driver GD having a transmission area, the at least one moisture-permeating prevention portion 300 may be formed in a shape which is partially overlapped with the area where the thin film transistor GDT of the gate driver GD is disposed.

The at least one moisture-permeating prevention portion 300 may include an organic pattern D_PLN formed of an organic insulating material and a transmission slit portion D_PLN_S between the adjacent organic patterns D_PLN. The organic pattern D_PLN may be disposed while being overlapped with a portion of the gate driving circuit of the gate driver GD. The organic pattern D_PLN may be disposed to overlap at least one thin film transistor GDT constituting the gate driver GD. Also, the organic pattern D_PLN may be formed in a simulated shape corresponding to a non-transmission area of the pixel disposed in the display area AA. For example, the organic pattern D_PLN may be provided in the same layer as the planarization film PLN over the first substrate 111 and may be formed of the same material as the planarization film PLN. The transmission slit portion D_PLN_S may be disposed so as not to overlap at least one thin film transistor GDT constituting the gate driver GD. The transmission slit portion D_PLN_S may be formed in a simulated shape corresponding to the transmission area of the pixel disposed in the display area AA. For example, the transmission slit portion D_PLN_S may be formed by patterning the adjacent organic patterns D_PLN to be spaced apart from each other, or may be formed together with the organic pattern D_PLN through an etching process for the organic insulating material (e.g., planarization film PLN). However, the present disclosure is not limited thereto.

According to an embodiment of the present disclosure, the organic pattern D_PLN and the transmission slit portion D_PLN_S of the at least one moisture-permeating prevention portion 300 may be arranged to have the same or similar shape to the transmission area and the non-transmission area disposed in the display area AA, thereby forming an uneven shape according to the step coverage between the organic pattern D_PLN and the transmission slit portion D_PLN_S over the bezel dam portion BZ_D of the first substrate 111. Accordingly, the light emitting layer 130 disposed in the bezel dam portion BZ_D may be formed in an uneven shape having a shape which is similar to that of the display area AA by the at least one moisture-permeating prevention portion 300.

According to an embodiment of the present disclosure, since the light emitting layer 130 is formed in an uneven shape having a shape similar to that of the display area AA in the bezel dam portion BZ_D by the moisture-permeating prevention portion 300, the visibility difference between the display area AA and the bezel area BZ may be improved, and a moisture permeation path by the light emitting layer 130 may be blocked and extended. Accordingly, the transparent display device 100 according to an embodiment of the present disclosure may reduce the visibility difference between the display area AA and the bezel area BZ by the light emitting layer 130 extending to the bezel area BZ, and may effectively block the moisture permeation path, thereby improving reliability of the device.

Referring to FIG. 6B, the at least one moisture-permeating prevention portion 300 according to an embodiment of the present disclosure may be disposed over the thin film transistor GDT of the gate driver GD disposed over the first substrate 111 and the plurality of inorganic insulating films PL including the buffer film BF, the gate insulating film GI, the interlayer insulating film ILD, and the passivation film PAS for covering (or overlaying) the thin film transistor GDT.

The light emitting layer 130 extending from the display area AA may be disposed over the at least one moisture-permeating prevention portion 300. In addition, the capping layer CPL and the encapsulation layer EP L may be sequentially stacked over the light emitting layer 130. The at least one moisture-permeating prevention portion 300 may be disposed in the bezel dam portion BZ_D. Each of the at least one moisture-permeating prevention portion 300 may be formed in a simulated shape with a structure which is the same as or similar to that of a pixel disposed in the display area AA. Also, if the gate driver GD is implemented as a transparent gate driver GD having a transmission area, the at least one moisture-permeating prevention portion 300 may be formed in a shape which is partially overlapped with the area where the thin film transistor GDT of the gate driver GD is disposed.

The at least one moisture-permeating prevention portion 300 may include an organic pattern D_PLN' formed of an organic insulating material and a transmission slit portion D_PLN_S disposed between the adjacent organic patterns D_PLN'. The transmission slit portion D_PLN_S may include an undercut structure D U C that exposes at least a portion of the lower edge of the organic pattern D_PLN'. For example, an upper surface of the plurality of inorganic insulating films PL including the buffer film BF, the interlayer insulating film ILD, and the passivation film PAS disposed over the first substrate 111 may be exposed in the transmission slit portion D_PLN_S, and the undercut structure D U C of the transmission slit portion D_PLN_S may be formed through a wet etching process for the exposed plurality of inorganic insulating films PL. For example, the plurality of inorganic insulating films PL exposed through the transmission slit portion D_PLN_S may be over-etched to expose the lower edge of the organic pattern D_PLN', whereby side surfaces of the plurality of inorganic insulating films PL may be inwardly provided in comparison to the organic pattern D_PLN' in the area overlapped with the edge of the organic pattern D_PLN', to thereby form the undercut structure D U C of the transmission slit portion D_PLN_S. However, the present disclosure is not limited thereto.

According to an embodiment of the present disclosure, the organic pattern D_PLN and the transmission slit portion D_PLN_S of the at least one moisture-permeating prevention portion 300 may be disposed to have the same or similar shape to the transmission area and the non-transmission area disposed in the display area AA, and the undercut structure D U C may be formed in the transmission slit portion D_PLN_S, thereby forming an uneven shape having the undercut structure over the bezel dam portion BZ_D of the first substrate 111. Accordingly, the light emitting layer 130 disposed in the bezel dam portion BZ_D may have a shape similar to that of the display area AA by the at least one moisture-permeating prevention portion 300 having the undercut structure D U C, and may be formed in an uneven shape which is disconnectedly provided in each undercut structure D U C.

According to an embodiment of the present disclosure, since the light emitting layer 130 is configured to have a shape similar to that of the display area AA in the bezel dam portion BZ_D by the moisture-permeating prevention portion 300 having the undercut structure D U C and is formed in a disconnectedly-provided uneven shape, the visibility difference between the display area AA and the bezel area BZ may be improved, and a moisture permeation path by the light emitting layer 130 may be blocked and extended. Accordingly, the transparent display device 100 according to an embodiment of the present disclosure may reduce the visibility difference between the display area AA and the bezel area BZ by the light emitting layer 130 extending to the bezel area BZ, and may effectively block the moisture permeation path, thereby improving reliability of the device.

The transparent display device according to the present disclosure may reduce the difference in visibility between the display area and the non-display area and may prevent the moisture permeation path and the separation phenomenon.

In the transparent display device according to the present disclosure, the light emitting layer of the display area extends to the non-display area, and the separating prevention portion providing the uneven shape is disposed in the bezel edge portion exposed without being covered by the dam portion, whereby it is possible to extend the moisture permeation path by the light emitting layer. Also, even if the swelling occurs in the outermost light emitting layer due to moisture, the light emitting layer may be disconnectedly provided by the uneven structure, thereby preventing the diffusion of the separation phenomenon of the light emitting layer.

In the transparent display device according to the present disclosure, the light emitting layer of the display area is extended to the non-display area, and the separating prevention portion having the uneven shape with the undercut structure is disposed in the bezel edge portion exposed without being covered by the dam portion, whereby the moisture permeation path may be disconnectedly extended by the light emitting layer. Also, even if the swelling occurs in the outermost light emitting layer due to moisture, the light emitting layer may be disconnectedly provided by the uneven structure, thereby preventing the diffusion of the separation phenomenon of the light emitting layer.

Accordingly, the transparent display device according to the present disclosure may improve the aesthetic sense by implementing the transparent bezel overcoming the problem related with the visibility difference, and may prevent the moisture permeation path and the separation phenomenon, thereby improving the reliability of the device.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of an embodiments can be modified, if necessary to employ concepts of the various patents, applications and publications to provide yet further embodiments.

These and other changes can be made to an embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display device, comprising:
a first substrate including a display area and a non-display area surrounding the display area;
a light emitting structure disposed in the display area, the light emitting structure including a light emitting layer;
a second substrate facing the first substrate;
a dam portion disposed between the non-display area of the first substrate and the second substrate, the dam portion surrounding the display area in a plan view; and
a separating prevention portion disposed between an outer periphery of the dam portion and an end of the non-display area and over the first substrate,
wherein the light emitting layer of the light emitting structure extends from the display area to the end of the non-display area,
wherein the dam portion is formed of a transparent material,
wherein the dam portion includes a first dam pattern portion about an outer line of the dam portion in the non-display area over the first substrate,
wherein at least one of the first dam pattern portions is formed of at least one organic insulating material,
wherein the first dam pattern portion includes:
at least one first organic pattern of an organic insulating material; and
a second organic pattern of an organic insulating material, overlapped with the at least one first organic pattern and configured to support the at least one first organic pattern, and wherein the first organic patterns of the first dam pattern portion are spaced apart from each other over the second organic pattern and are disposed in parallel to each other.

2. The transparent display device according to claim 1, wherein the light emitting layer is disposed over the separating prevention portion.

3. The transparent display device according to claim 2, wherein the light emitting layer is disconnected by the separating prevention portion in the non-display area.

4. The transparent display device according to claim 1, wherein the separating prevention portion offsets from the dam portion.

5. The transparent display device according to claim 1, wherein the separating prevention portion has a closed loop shape surrounding the outer periphery of the dam portion in the plan view.

6. The transparent display device according to claim 1, wherein the separating prevention portion includes:
  at least one peeling pattern formed of an organic insulating material; and
  a slit portion for isolating the at least one peeling pattern.

7. The transparent display device according to claim 6, wherein adjacent peeling patterns of the at least one peeling pattern are spaced apart from each other with the slit portion interposed between the adjacent peeling patterns, and the adjacent peeling patterns disposed in parallel with each other.

8. The transparent display device according to claim 6, wherein the slit portion of the separating prevention portion includes an undercut structure which exposes at least a portion of the lower edge of the peeling pattern; and
  wherein the light emitting layer in the non-display area is disconnected by the undercut structure of the slit portion.

9. The transparent display device according to claim 8, further comprising:
  a plurality of inorganic insulating films disposed between the separating prevention portion and the first substrate and formed of an inorganic insulating material, wherein the undercut structure of the slit portion is formed by removing at least a portion of the plurality of inorganic insulating films.

10. The transparent display device according to claim 1, wherein the separating prevention portion includes:
  a plurality of peeling patterns; and
  a plurality of slit portions, two adjacent slit portions of the plurality of slit portions disposed with a peeling pattern of the plurality of peeling patterns interposed between the two adjacent slit portions.

11. The transparent display device according to claim 10, wherein each of the plurality of slit portions of the separating prevention portion includes an undercut structure which exposes at least a portion of a lower edge of an adjacent peeling pattern, and
  wherein the light emitting layer in the non-display area is disconnected by the undercut structure in each of the plurality of slit portions.

12. The transparent display device according to claim 1, wherein the separating prevention portion is disposed between an outer periphery of the first dam pattern portion and the end of the non-display area,
  the second dam pattern portion is disposed adjacent to the display area, and at least one moisture-permeating prevention portion is disposed between the first dam pattern portion and the second dam pattern portion in the non-display area over the first substrate.

13. The transparent display device according to claim 1, further comprising:
  a gate driver including a plurality of gate driving circuits in the non-display area, wherein the second dam pattern portion is disposed between the gate driver and the display area.

14. The transparent display device according to claim 1, further comprising:
  a first upper dam pattern portion disposed adjacent to the second substrate and overlapped with at least a portion of the first dam pattern portion,
  wherein the first upper dam pattern portion includes a transparent insulating material.

15. The transparent display device according to claim 1, wherein the second organic pattern the first dam pattern portion includes a slit portion disposed between two adjacent first organic patterns.

16. The transparent display device according to claim 15, wherein the slit portion of the second organic pattern includes an undercut structure which exposes at least a portion of a lower edge of the second organic pattern, and
  wherein the light emitting layer in the non-display area is disconnectedly provided by the undercut structure of the slit portion.

17. The transparent display device according to claim 16, further comprising:
  a plurality of inorganic insulating films disposed between the second organic pattern and the first substrate and formed of an inorganic insulating material, wherein the undercut structure of the slit portion is formed by removing at least a portion of the plurality of inorganic insulating films.

18. The transparent display device according to claim 1, wherein the first dam pattern portion includes:
  a plurality of first organic patterns spaced apart from each other; and
  a second organic pattern overlapped with the plurality of first organic patterns and configured to support the plurality of first organic patterns.

19. The transparent display device according to claim 1, wherein the first dam pattern portion includes:
  a plurality of first organic patterns spaced apart from each other; and
  a plurality of second organic patterns to respectively support the plurality of first organic patterns.

20. The transparent display device according to claim 19, further comprising a plurality of slit portions disposed between the plurality of first and second organic patterns.

21. The transparent display device according to claim 19, wherein each of the plurality of slit portions includes an undercut structure which exposes at least a portion of the lower edge of the second organic pattern, and
  wherein the light emitting layer in the non-display area is disconnected by the undercut structure of each of the plurality of slit portions.

22. The transparent display device according to claim 1, further comprising:
  a gate driver disposed to overlap the dam portion in the non-display area over the first substrate and configured to include a plurality of gate driving circuits; and at least one moisture-permeating prevention portion partially overlapped with the gate driver in the non-display area over the first substrate.

23. The transparent display device according to claim 22, wherein the at least one moisture-permeating prevention portion is disposed in the dam portion.

24. The transparent display device according to claim 22, wherein the at least one moisture-permeating prevention portion includes:

organic patterns partially overlapped with the plurality of gate driving circuits and formed of an organic insulating material; and a transmission slit portion disposed between adjacent organic patterns.

25. The transparent display device according to claim 24, wherein the transmission slit portion of the at least one moisture-permeating prevention portion includes an undercut structure which exposes at least a portion of the lower edge of the organic pattern, and wherein the light emitting layer in the non-display area is disconnected by the undercut structure of the transmission slit portion.

26. The transparent display device according to claim 25, further comprising:

a plurality of insulating films disposed between the at least one moisture-permeating prevention portion and the first substrate and formed of an inorganic insulating material, wherein the undercut structure of the transmission slit portion is formed by removing at least a portion of the plurality of inorganic insulating films.

27. The transparent display device according to claim 24, wherein the at least one moisture-permeating prevention portion is formed in a simulated shape corresponding to a pixel including a transmission area disposed in the display area and a non-transmission area in which the light emitting element is disposed.

28. The transparent display device according to claim 27, wherein the organic pattern of the at least one moisture-permeating prevention portion is formed in a simulated shape corresponding to a non-transmission area of the pixel, and wherein the transmission slit portion of the at least one moisture-permeating prevention portion is formed in a simulated shape corresponding to a transmission area of the pixel.

29. A transparent display device, comprising:

a display area and a non-display area over a first substrate;

a light emitting structure disposed in the display area, the light emitting structure including a light emitting layer, the light emitting layer extending over the non-display area;

a dam structure over the light emitting layer and over the non-display area, the dam structure surrounding the display area; and a first plurality of protrusion structures between the light emitting layer and the first substrate in the non-display area, the first plurality of protrusion structures each overlapping with the dam structure.

30. The transparent display device of claim 29, wherein the light emitting layer extends beyond the dam structure.

31. The transparent display device of claim 29, further comprising a second plurality of protrusion structures between the light emitting layer and the first substrate in the non-display area, the second plurality of protrusion structures each offsetting from the dam structure.

32. The transparent display device of claim 29, wherein a first protrusion structure of the first plurality of protrusion structures includes a first undercut portion, and wherein the light emitting layer disconnects at the first undercut portion.

33. The transparent display device of claim 31, wherein a second protrusion structure of the second plurality of protrusion structures includes a second undercut portion, and wherein the light emitting layer disconnects at the second undercut portion.

34. The transparent display device according to claim 1, wherein the dam portion further includes a second dam pattern portion about an inner line of the dam portion in the non-display area, and wherein at least one of the second dam pattern portion is formed of at least one organic insulating material.

35. The transparent display device according to claim 34, further comprises a second upper dam pattern portion disposed adjacent to the second substrate and overlapped with at least a portion of the second dam pattern portion, wherein the second upper dam pattern portion includes a transparent insulating material.

36. The transparent display device according to claim 34, wherein the second dam pattern portion includes:

at least one first organic pattern of an organic insulating material; and a second organic pattern of an organic insulating material, overlapped with the at least one first organic pattern and configured to support the at least one first organic pattern.

37. The transparent display device according to claim 36, wherein the first organic patterns of the first dam pattern portion are spaced apart from each other over the second organic pattern and are disposed in parallel to each other.

38. The transparent display device according to claim 36, wherein the second organic pattern of the first dam pattern portion includes a slit portion disposed between two adjacent first organic patterns.

39. The transparent display device according to claim 34, wherein the second dam pattern portion includes:

a plurality of first organic patterns spaced apart from each other; and a second organic pattern overlapped with the plurality of first organic patterns and configured to support the plurality of first organic patterns.

40. The transparent display device according to claim 34, wherein the second dam pattern portion includes:

a plurality of first organic patterns spaced apart from each other; and a plurality of second organic patterns to respectively support the plurality of first organic patterns.

* * * * *